United States Patent
Huang et al.

(10) Patent No.: US 6,727,160 B1
(45) Date of Patent: Apr. 27, 2004

(54) METHOD OF FORMING A SHALLOW TRENCH ISOLATION STRUCTURE

(75) Inventors: Chian-Kai Huang, Kaohsiung (TW); Fung-Hsu Cheng, Taoyuan (TW); Jui-Ping Li, Hsinchu (TW)

(73) Assignee: Silicon Integrated Systems Corp., Hsin Chu (TW)

( * ) Notice: Subject to any disclaimer, the term of this patent is extended or adjusted under 35 U.S.C. 154(b) by 0 days.

(21) Appl. No.: 10/270,348

(22) Filed: Oct. 15, 2002

(51) Int. Cl.⁷ .................................. H01L 21/76
(52) U.S. Cl. ........................................ 438/435
(58) Field of Search .................. 438/424, 435, 438/437, 439

(56) References Cited

U.S. PATENT DOCUMENTS

| | | | | |
|---|---|---|---|---|
| 5,780,346 A | * | 7/1998 | Arghavani | 438/437 |
| 6,051,478 A | * | 4/2000 | Ibok | 438/424 |
| 6,140,251 A | * | 10/2000 | Arghavani et al. | 438/778 |
| 6,387,777 B1 | * | 5/2002 | Hurley | 438/439 |
| 6,503,815 B1 | * | 1/2003 | Hsu | 438/435 |
| 6,583,025 B2 | * | 6/2003 | Hong | 438/424 |

* cited by examiner

Primary Examiner—Long Pham
Assistant Examiner—Anh Duy Mai
(74) Attorney, Agent, or Firm—Birch, Stewart, Kolasch & Birch, LLP

(57) ABSTRACT

A method of forming a STI structure. First, a substrate having a trench is provided. Next, a conformable silicon oxide layer is grown on the surface of the trench by wet oxidation using single wafer process to serve as a liner oxide layer. Thereafter, the substrate and the silicon oxide layer is in-situ annealed. Finally, an insulating layer is completely filled into the trench.

14 Claims, 5 Drawing Sheets

METHOD OF FORMING A SHALLOW TRENCH ISOLATION STRUCTURE

BACKGROUND OF THE INVENTION

1. Field of the Invention

The present invention relates in general to a semiconductor technology. More particularly, it relates to a method of forming a shallow trench isolation (STI) structure.

2. Description of the Related Art

An isolation region is formed in an integrated circuit for the purpose of separating neighboring device regions thereof and preventing carriers from penetrating the substrate to neighboring devices.

Among different element isolation techniques, LOCOS and shallow trench isolation manufacturing methods are the two most used methods. In particular, as the latter has a small isolation region and can keep the substrate level after the process is finished, it is the semiconductor manufacturing method obtaining the most attention.

FIG. 1 is a schematic cross-section showing a conventional shallow trench isolation structure. In FIG. 1, a pad oxide layer and a silicon nitride layer (not shown) are formed on a silicon substrate 10. The silicon nitride layer and the pad oxide layer are patterned by lithography and etching, and a trench is then formed in the substrate 10 by etching using the silicon nitride layer as a mask. A liner oxide layer 14 is formed by thermal oxidation on the surface of the trench. Chemical vapor deposition (CVD) oxide layer is deposited and filled into the trench. The excess oxide layer over the silicon nitride layer is removed by chemical mechanical polishing (CMP) to complete the shallow trench isolation structure 16. The silicon nitride layer arid the pad oxide layer are then removed.

Because the property of the element isolation structure 16 is similar to that of the pad oxide layer and liner oxide layer 14, when etching liquid is used to remove pad oxide layer, the element isolation structure 16 is inevitably etched so that the liner oxide layer 14 at the top corner 20 of the trench develops a sharp edge, increasingly attracting the focus of the electric field, hence the the insulating properties of the top corner 20 degrades, resulting in abnormal element characteristics.

Moreover, the etching used for forming the trench in the substrate 10 and the thermally grown liner oxide layer 14 induce stresses into the substrate 10. For example, the stresses concentrate at the top corner 20 and bottom corner 22 of the trench, resulting in inducing leakage current. In addition, more operation time is required for growing liner oxide by thermal oxidation, thus reducing the throughput. Moreover, since typical semiconductor factories use batch furnaces for thermal oxidation, the thin film uniformity is varied, reducing the reliability of the devices.

SUMMARY OF THE INVENTION

Accordingly, an object of the invention is to provide a method of forming a shallow trench isolation structure, wherein a liner oxide layer is formed by wet oxidation using single wafer process at high temperatures to obtain a rounder liner oxide layer at the top corner of the trench and increase the uniformity of the liner oxide layers in each wafer to be fabricated.

Another object of the invention is to provide a method of forming a shallow trench isolation structure, wherein in-situ annealing is performed after the liner oxide growth to release stress and prevent dopant diffusion to the STI structure from the device region.

To achieve these and other advantages, the invention provides a method of forming a shallow trench isolation structure. First, a substrate having a trench is provided. Next, a conformable silicon oxide layer is grown on the surface of the trench by wet oxidation using single wafer process to serve as a liner oxide layer. Thereafter, the substrate and the silicon oxide layer is in-situ annealed. Finally, an insulating layer is completely filled into the trench.

The silicon oxide layer has a thickness of about 150~250 Å and can be formed at about 1100~1200° C. using hydrogen and oxygen as reaction gases. Moreover, the flow rates of the hydrogen and oxygen are about 10~16 slm and 5~8 slm, respectively.

Moreover, the annealing is performed in an atmosphere of nitrogen or nitrous oxide at about 1100~1200° C. for 20~60 sec. The insulating layer is high density plasma oxide.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

A preferred embodiment of the present invention is now described with reference to FIGS. 2a through 2g.

Figure 1:
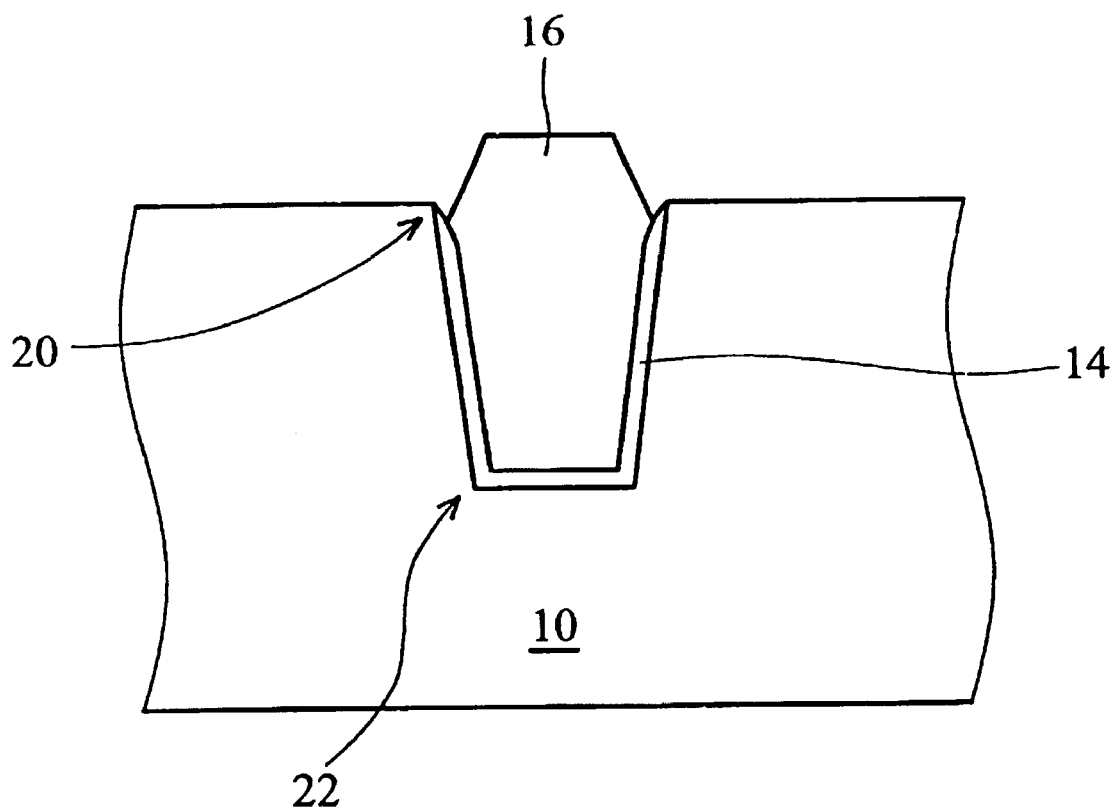
FIG. 1 is a schematic cross-section showing a conventional shallow trench isolation structure.
Figure 2A:
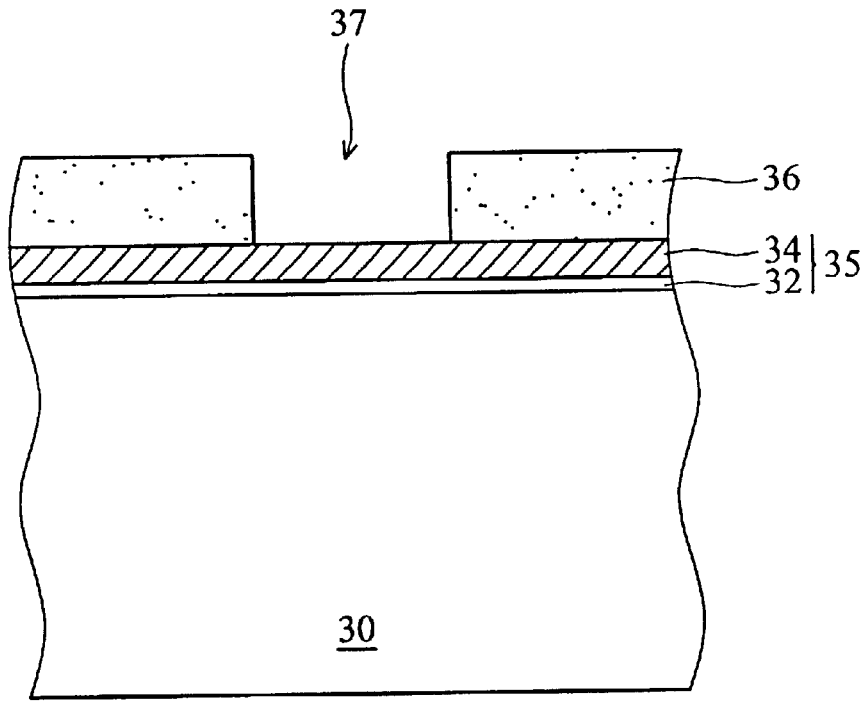
FIGS. 2a through 2g are cross-sections showing a method of forming a shallow trench isolation structure according to the present invention.

First, in FIG. 2a, a semiconductor substrate, such as a silicon wafer 30, is provided. A mask layer 35 is formed on the substrate 30. The mask layer 35 preferably has a thickness of about 200~3500 Å and can be a single layer or a plurality of layers. As shown in FIG. 1, the mask layer 35 is preferably composed of a pad oxide layer 32 and a thicker silicon nitride layer 34. In this invention, the pad oxide layer 32 has a thickness of about 100 Å and can be formed by thermal oxidation or conventional CVD, such as atmospheric pressure CVD (APCVD) and low pressure CVD (LPCVD). The silicon nitride layer 34 overlying the pad oxide layer 32 has a thickness of about 1000~2000 Å and can be formed by LPCVD using $SiCl_2H_2$ and $NH_3$ as reaction source. Next, a photoresist layer 36 is coated on the mask layer 35. Thereafter, lithography is performed on the photoresist layer 36 to form an opening 37 inside. The opening 37 defines shallow trench isolation region.

Figure 2B:
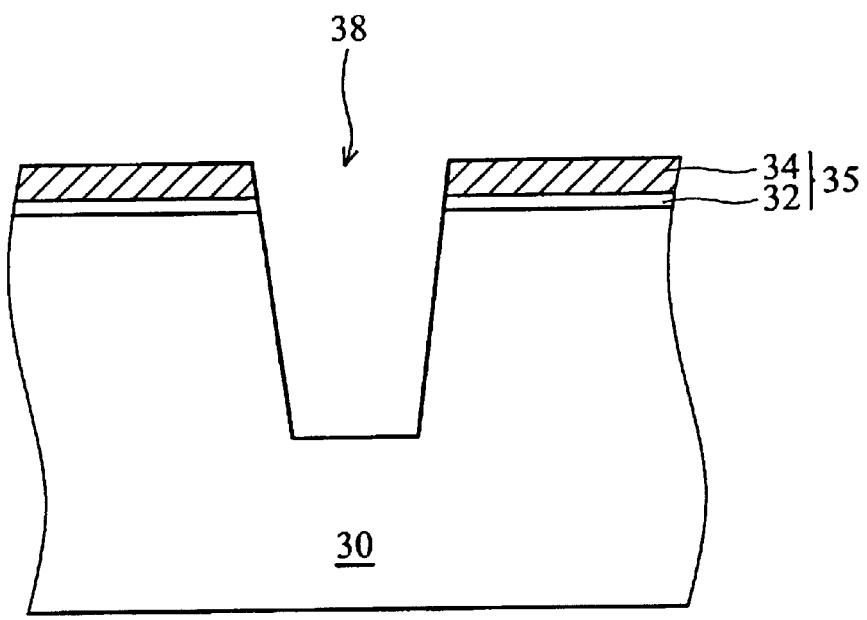

Subsequently, in FIG. 2b, the photoresist layer 36 having the opening 37 is used as a mask to anisotropically etch the mask layer 35, for example, reactive ion etching (RIE), to transfer the opening 37 pattern of the photoresist layer 36 to the mask layer 35 inside. Next, suitable wet etching or ashing is performed to remove the photoresist layer 36. Next, anisotropic etching is performed using the mask layer 35 as an etch mask, for example, the RIE, etching silicon substrate 30 under the opening in the mask layer 35 to a predetermined depth, such as about 3000~6000 Å, to form a trench 38 in the silicon substrate 30.

Figure 2C:
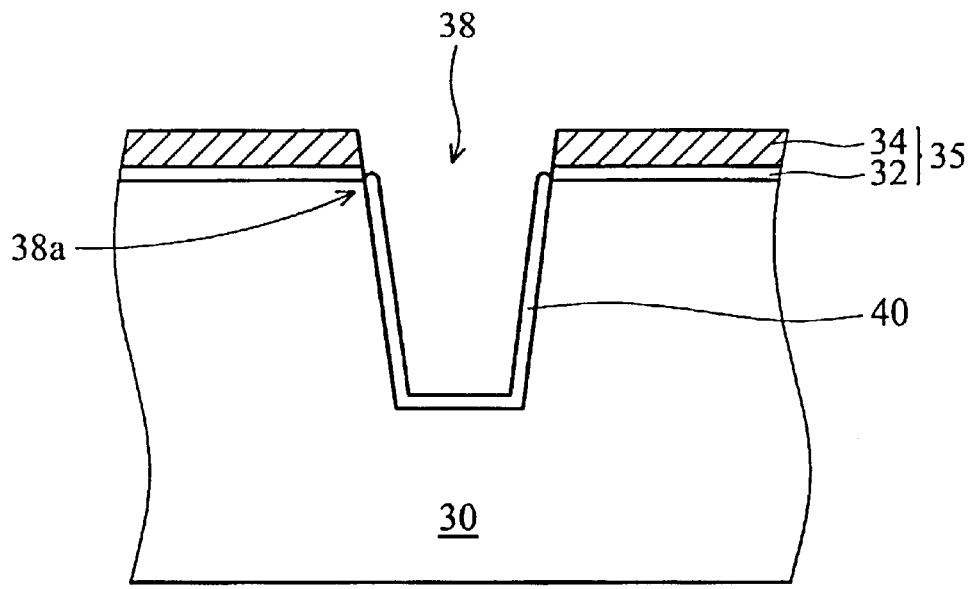
Figure 2D:
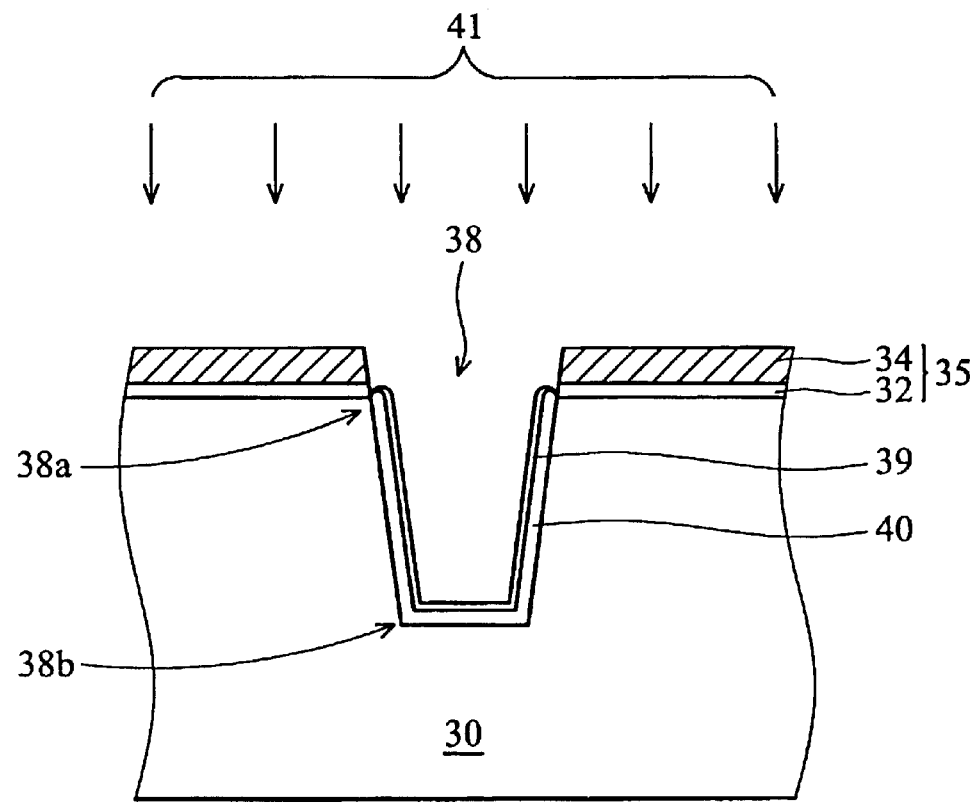

Next, FIGS. 2c to 2d show the critical steps of the invention. In FIG. 2c, a conformable silicon oxide layer 40 with a thickness of about 150~250 Å grows on the surface of the trench 38 to serve as a liner oxide layer. In this invention, in order to obtain a rounder portion of the silicon oxide layer 40 at the top corner 38a of the trench 38, the silicon oxide layer 40 is not formed by conventional thermal oxidation using a batch furnace, but is formed by wet oxidation using single wafer system. For example, this single wafer process can be performed using Thermal Process Common Centura (TPCC), a deposition apparatus fabricated by APPLIED MATERIAL, using hydrogen and oxygen as reaction gases. The flow rates of hydrogen and oxygen are 10~16 slm and 5~8 slm, respectively. Preferred flow rates of hydrogen and oxygen are 12 slm and 6 slm, respectively. The working pressure is about 7~12 Torr, and preferred pressure is 9~10 Torr. The growth time of the silicon oxide layer 40 is 60~70 sec. In addition, TPCC has a higher growth temperature (1000~1200° C.) than conventional thermal furnace (800~900° C.), a higher temperature raising rate, and a higher growth rate to decrease the process time. Preferably, the growth temperature of the invention is 1150° C.

Next, in FIG. 2d, the substrate 30 and the silicon oxide layer 40 are in-situ annealed 41 in an atmosphere of nitrogen ($N_2$) or nitrous oxide ($N_2O$) for 20~60 sec. In-situ here indicates that there is no breach in the chamber vacuum. In this invention, in-situ annealing 41 is performed at the growth temperature mentioned above. That is, the annealing temperature is at 1100~1200° C. and the preferred annealing temperature is held at 1150° C. Here, there are three purposes for in-situ annealing 41 in an atmosphere of $N_2$ or $N_2O$ after growing the liner oxide layer 40. The first is to repair the rough interface between the trench 38 surface and the liner oxide layer 40 through silicon atoms from the substrate 30 completely bonding with the oxygen atoms from the liner oxide layer 40 to enhance the insulating properties of the liner oxide layer 40. The second is to realize stresses formed at the top corner 38a and bottom corner 38b of the trench 38 during etching trench 38 and growing liner oxide layer 40 to prevent electric field concentration while devices are operating. The third is to diffuse nitrogen atoms into the silicon oxide layer 40 and bond with silicon atoms and oxygen atoms therein. The Si-O-N bonds can barrier the dopant in the device region (not shown), diffusing into the STI structure in subsequent process to increase the reliability of the devices. In addition, the annealing 41 may form a thin sealing layer 39, such as silicon oxynitride (SiON), over the liner oxide layer 40 to enhance the diffusion barrier effect.

Figure 2E:
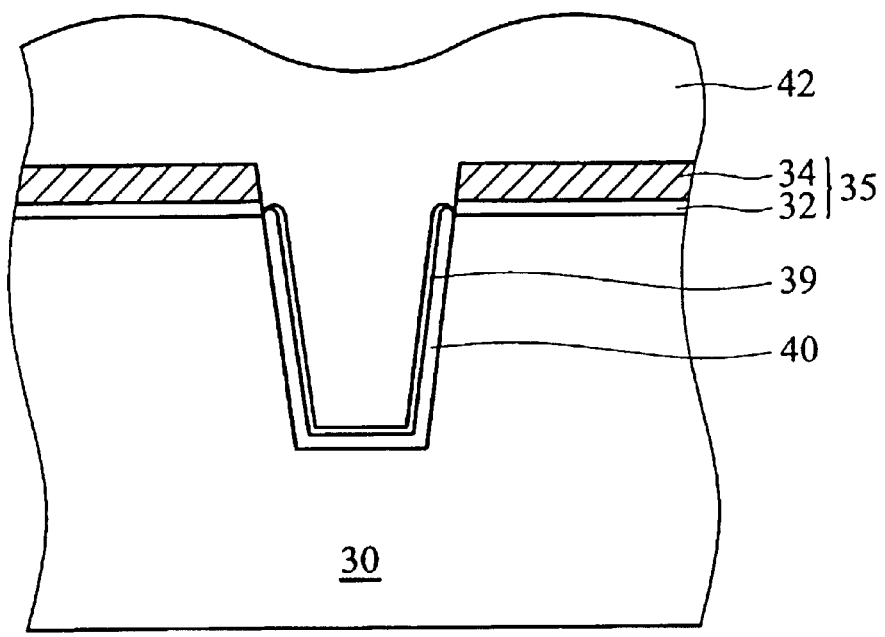

Next, in FIG. 2e, an insulating layer 42 is formed over the mask layer 35 and completely fills the trench 38. For example, the insulating layer 42 can be doped or undoped silicon oxide. Some doped silicon oxides include phosphorsilicate glass (PSG), boro-silicate glass (BSG), phosphorus boron silicate glass (BPSG), and the like. Some undoped silicon oxides include thermal tetraethyl orthosilicate (TEOS) and high-density plasma (HDP) silicon oxides. In this invention, the preferred insulating layer 42 is HDP silicon oxide formed by HDPCVD. Subsequently, annealing or rapid thermal process (RTP) is performed to densitize the insulating layer 42.

Figure 2F:
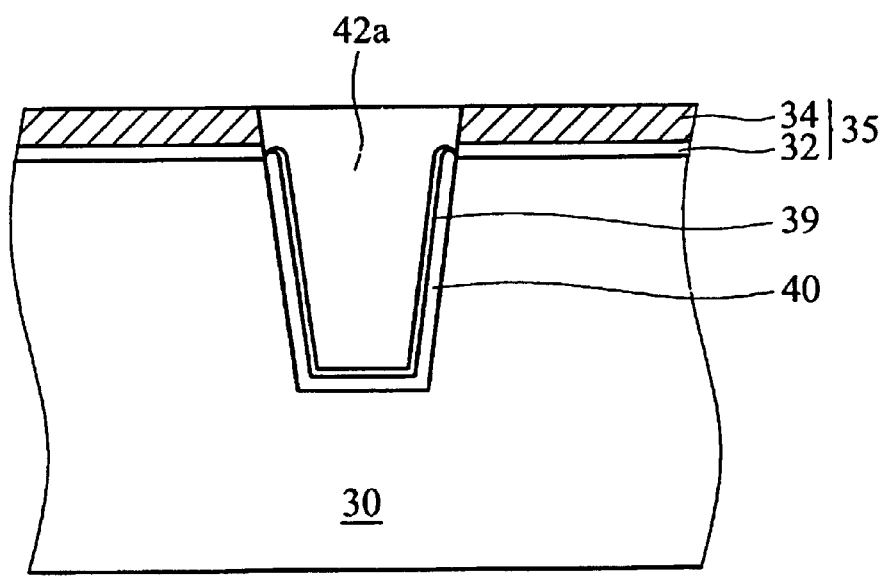

Next, in FIG. 2f, the excess insulating layer 42 over the mask layer 35 is removed to form shallow trench isolation (STI) structure 42a. The method for removing the excess insulating layer 44 is, for example, CMP.

Figure 2G:
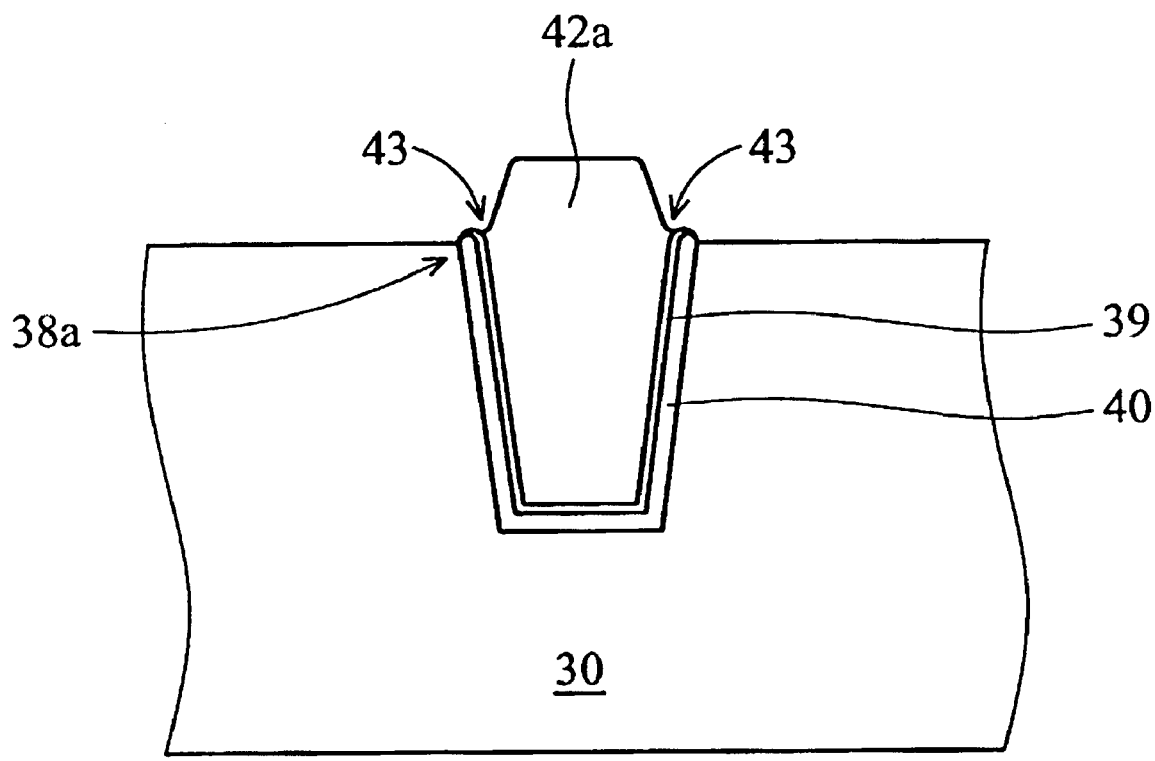

Finally, in FIG. 2g, the mask layer 35 is removed. The method of removing the silicon nitride layer 34, for example, is soaking with hot $H_3PO_4$, and the method of removing pad oxide layer 32, for example, is soaking with HF liquid. In addition, when removing pad oxide layer 32, part of STI structure 42a will be removed at the same time to form recess 43 at the top corner 38a of the STI structure 42a. However, as mentioned above, since the portion of the liner oxide layer 40 at the top corner 38a is rounder, the recess effect can be minimized to avoid leakage current induced.

Compared with the prior art, the liner oxide layer of the invention is formed by single wafer process. Accordingly, it can increase the uniformity of the liner oxide layers in each wafer to be fabricated. Moreover, according to the invention, the throughput can be increased due to the shorter process time required. In addition, the step of in-situ annealing of the invention can increase the quality of the line oxide to ensure the insulating properties of the STI structure.

The foregoing description has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method of forming a shallow trench isolation structure, comprising the steps of:

providing a substrate having a trench;

growing a conformable silicon oxide layer on the surface of the trench by wet oxidation using single wafer process to serve as a liner oxide layer; wherein the wet oxidation is performed using hydrogen and oxygen as reaction gases and wherein the flow rates of the hydrogen and oxygen are about 10~16 slm and 5~8 slm, respectively in-situ annealing the substrate and the silicon oxide layer; and filling an insulating layer into the trench.

2. The method as claimed in claim 1, wherein the silicon oxide layer thickness of about 150~250 Å.

3. The method as claimed in claim 1, wherein the silicon oxide layer is grown at about 1100~1200° C.

4. The method as claimed in claim 1, wherein the annealing is performed in an atmosphere of nitrogen or nitrous oxide.

5. The method as claimed in claim 1, wherein the annealing is performed for 20~60 sec.

6. The method as claimed in claim 1, wherein the annealing is performed at about 1100~1200° C.

7. The method as claimed in claim 1, wherein the insulating layer is high density plasma oxide.

8. A method of forming a shallow trench isolation structure, comprising the steps of:

providing a substrate covered by a mask layer;

etching the mask layer to form a least one opening to expose the substrate;

etching the substrate under the opening to form a trench in the substrate;

growing a conformable silicon oxide layer on the surface of the trench at a predetermined temperature by wet oxidation using single wafer process to serve as a liner oxide layer; wherein the wet oxidation is performed using hydrogen and oxygen as reaction gases and wherein the flow rates of the hydrogen and oxygen are about 10~16 slm and 5~8 slm, respectively in-situ annealing the substrate and the silicon oxide layer at the predetermined temperature;

forming an insulating layer over the mask layer and filling in the trench;

removing the insulating layer over the mask layer; and removing the mask layer.

9. The method as claimed in claim 8, wherein the silicon oxide layer has a thickness of about 150~250 Å.

10. The method as claimed in claim 8, wherein the predetermined temperature is at about 1100~1200° C.

11. The method as claimed in claim 8, wherein the annealing is performed in an atmosphere of nitrogen or nitrous oxide.

12. The method as claimed in claim 8, wherein the annealing is performed for 20~60 sec.

13. The method as claimed in claim 8, wherein the insulating layer is high density plasma oxide.

14. The method as claimed in claim 8, wherein the insulating layer over the mask layer is removed by chemical mechanic polishing.

* * * * *